United States Patent
Sautto et al.

(10) Patent No.: US 10,303,193 B2
(45) Date of Patent: May 28, 2019

(54) VOLTAGE REGULATOR CIRCUIT, CORRESPONDING DEVICE, APPARATUS AND METHOD

(71) Applicant: STMicroelectronics S.r.l., Agrate Brianza (IT)

(72) Inventors: Marco Sautto, Vittuone (IT); Davide Betta, Barzanò (IT); Agostino Mirabelli, Lomello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/928,934

(22) Filed: Mar. 22, 2018

(65) Prior Publication Data
US 2018/0284826 A1    Oct. 4, 2018

(30) Foreign Application Priority Data
Mar. 31, 2017 (IT) .................. 102017000035474

(51) Int. Cl.
    *G05F 1/59*    (2006.01)
    *H03F 3/45*    (2006.01)
    *G05F 1/595*   (2006.01)
    *G05F 1/575*   (2006.01)

(52) U.S. Cl.
    CPC ............... *G05F 1/59* (2013.01); *G05F 1/575* (2013.01); *G05F 1/595* (2013.01); *H03F 3/45273* (2013.01)

(58) Field of Classification Search
    CPC ........ H02J 1/10; H02J 7/34; H02J 3/38; H02J 9/04; H02J 2001/008; Y10T 307/505; Y10T 307/587; G05F 1/461; G05F 1/56; G05F 1/59; G05F 1/562
    See application file for complete search history.

(56) References Cited

U.S. PATENT DOCUMENTS

| | | | | |
|---|---|---|---|---|
| 4,638,175 | A | * | 1/1987 | Bradford ................. G06F 1/189 307/64 |
| 4,779,037 | A | | 10/1988 | LoCascio |
| 6,097,178 | A | | 8/2000 | Owen et al. |

(Continued)

OTHER PUBLICATIONS

Micrel Inc., "MIC23060—Sequenced Power Management IC with HyperLight Load™ DC/DC and Dual Input LDO™" data sheet, M999-042210-B, Apr. 2010, 15 pages.

*Primary Examiner* — Gary L Laxton
(74) *Attorney, Agent, or Firm* — Seed IP Law Group LLP

(57) ABSTRACT

A dual-input, single-output low-dropout voltage regulator circuit includes: a first supply terminal, a second supply terminal and an output terminal, and first and second transistors having current paths coupled respectively between the first and second terminal and the output terminal. First and second drive circuit blocks are coupled respectively to the first and second supply terminals and drive the control terminals of the first and second transistors to provide a regulated voltage at the output terminal from the voltage on the first supply terminal and the second supply terminal. An input circuit block is sensitive to the voltage at the output terminal and is coupled to the first and second drive circuit blocks and configured to activate the second transistor to provide regulated voltage at the output terminal from the second terminal as a result of the voltage at the output terminal becoming lower than a desired value.

17 Claims, 3 Drawing Sheets

(56) References Cited

U.S. PATENT DOCUMENTS

| | | | |
|---|---|---|---|
| 6,198,262 B1 | 3/2001 | Squibb et al. | |
| 6,952,093 B1 * | 10/2005 | Broach | H02M 3/156 323/282 |
| 7,535,122 B2 * | 5/2009 | Visairo-Cruz | H02M 1/10 307/43 |
| 8,564,249 B2 * | 10/2013 | Lundqvist | H02J 1/10 307/44 |
| 2010/0060078 A1 | 3/2010 | Shaw | |

* cited by examiner

VOLTAGE REGULATOR CIRCUIT, CORRESPONDING DEVICE, APPARATUS AND METHOD

BACKGROUND

Technical Field

The present description relates generally to voltage regulation, and one or more embodiments may apply, for instance, to power management devices or motor driver (integrated) circuits for applications such as hard disk drives (HDD's).

Description of the Related Art

Voltage regulation is an area of intensive activity as evidenced by documents such as:
U.S. Pat. No. 4,779,037,
U.S. Pat. No. 6,198,262 B1,
U.S. Patent Application Publication No. 2010/0060078 A1, and
commercial products such as MIC 23060 available from Micrel Inc. of San Jose, Calif. 95131, USA.

Despite the intensive activity in the area of voltage regulation, a demand still exists for improved solutions, for instance as regards aspects such as increased system efficiency, capability of taking as an input voltages from power supplies (VM) in an extended range (e.g., 9-18 V) with the capability of dealing with situations where such a power supply becomes too low, very low dropout voltages, and small area requirements.

BRIEF SUMMARY

One or more embodiments relate to voltage regulation devices. Power management devices or motor driver (e.g. integrated) circuits may be exemplary of such devices.

One or more embodiments may relate to corresponding apparatus including such a device. A hard disk drive (HDD) may be exemplary of such a device.

One or more embodiments may relate to a corresponding method for voltage regulation.

The claims are an integral part of the disclosure as provided herein.

One or more embodiments may provide a dual-input single-output voltage regulator with virtually "zero" dropout and automatic input selection.

One or more embodiments may provide one or more of the following advantages:
  increased system efficiency, e.g. by using a dual-input Low DropOut (LDO) arrangement;
  capability of taking as an input voltages from power supplies (VM) in an extended range (e.g. 9-18 V);
  capability of switching input to an internally generated power supply (VP) only when VM gets too low;
  VP generator suited to be switched off, with current flow from VM to
  VP virtually nil;
  very low dropout voltage; and
  small area requirement.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
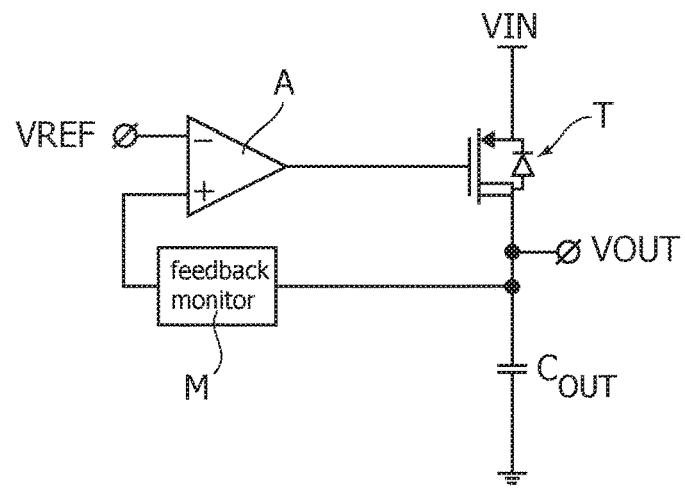
FIG. 1 is an exemplary diagram of a low dropout voltage regulator.

FIG. 1 is simplified circuit of a Low DropOut (LDO) voltage regulator. A main function of such a circuit is to provide a regulated output voltage VOUT (for instance across an output capacitor $C_{OUT}$) from an input voltage VIN by meeting the condition $$VIN > VOUT$$

with an efficiency given by:

$$\eta \approx \frac{VOUT}{VIN}.$$

For that purpose, the exemplary circuit of FIG. 1 may include a transistor T (for instance a MOSFET transistor) with its current path (source-drain, in the case of a field effect transistor such as a MOSFET) extending between VIN and VOUT and its control terminal (gate, in the case of a field effect transistor such as a MOSFET) coupled to the output of a differential stage A (e.g., an operational amplifier) having a first (e.g., inverting) input coupled to a reference voltage VREF and a second (e.g., non-inverting) input coupled with the output of a feedback monitor M sensitive to the output voltage VOUT.

From the previous equations, one may note that a high efficiency of the regulator is facilitated by having VIN higher than VOUT but very close to it.

Figure 2:
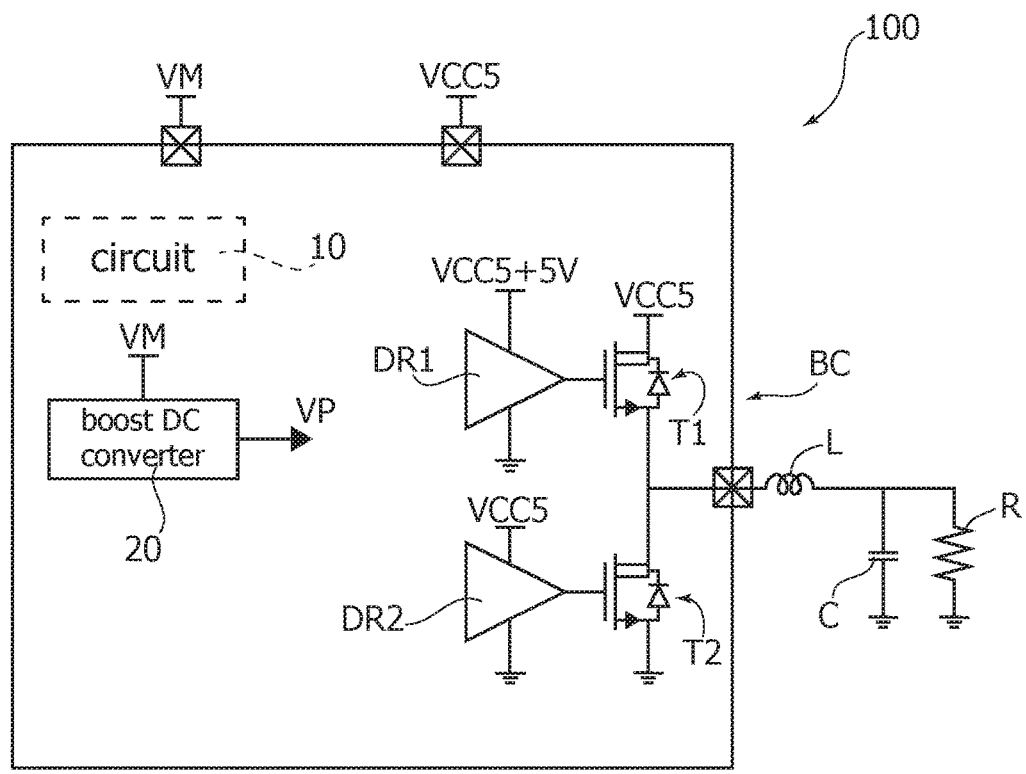
FIG. 2 is simplified schematic exemplary of possible contexts of use of embodiments of the present disclosure.

FIG. 2 is exemplary of a possible context of use of one or more embodiments (as included, e.g., in a hard disk drive—

Figure 6:
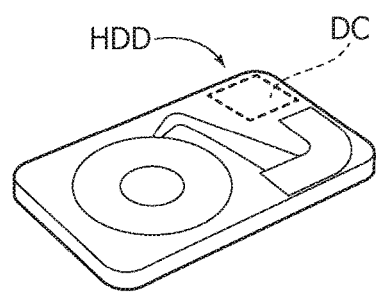
FIG. 6 is exemplary of possible contexts of use of embodiments of the present disclosure.

HDD: see also FIG. 6 in that respect), wherein a circuit as discussed herein is included in an integrated circuit (IC), with a corresponding chip is supplied with two externally provided voltage sources:

VM (this may be a voltage source with a nominal value of 12 V and exposed to variations in the range of, say, 9 V to 18 V);

VCC5 (this may be a voltage source with a nominal value of 5 V and exposed to variations in the range of, say, 4 V to 6 V).

The IC (designated 100 as a whole) may be intended to generate (regulated) voltages for various circuits in a same device/apparatus such as a HDD.

One or more DC-DC converters (e.g., of the "buck" type known in the art and including a half bridge) biased by VCC5 may be used for that purpose. One such converter, including two electronic switches (e.g., MOSFET transistors) T1, T2 plus respective drivers DR1, DR2 and an associated RLC network, is designated BC as a whole, is shown in FIG. 2.

The diagram of FIG. 2 also highlights the fact that one or more of the R (resistive), L (inductive) and C (capacitive) components of such a network may be distinct from the circuit 100.

Driving the "high side" MOS (T1) as shown is via a voltage higher than VCC5, e.g., a voltage VCC+5V which is 5V higher than VCC5, and one or more embodiments may provide a voltage regulator which facilitates generating such a voltage.

In one or more embodiments the IC 100 may also include a boost dc-dc converter 20, generating a voltage VP (nominal 20 V) e.g., from VM.

The table below shows possible values for the desired voltage (e.g., VCC5+5V) and the externally supplied voltage VM in normal (typical) conditions (TYP) and in worst-case conditions (WC).

| VCC5 + 5 V | | VM | |
|---|---|---|---|
| TYP | WC | TYP | WC |
| 10 | 11 | 12 | 9 |

For instance a typical desired voltage may be 10V while VM is 12 V, so that VM can be used as an input with high conversion efficiency. In the worst case a desired voltage may be 11 V, with VM being only 9 V. In the latter case, VM cannot be used as an input and a higher voltage, e.g., VP can be used for that purpose.

If a conventional LDO circuit as shown in FIG. 1 is used in order to meet specifications in the worst case scenario depicted above, VP should (always) be used as an input, with a negative impact on system efficiency.

In one or more embodiments achieving a high efficiency as desired is facilitated by using a dual input low drop out regulator (LDO) wherein:

VM can be taken as an input in normal (typical) conditions, the input is automatically switched to VP (only) when VM gets too low.

Additionally, in one or more embodiments:

the VP generator can be switched off, with no appreciable current flow from VM to VP;

the circuit exhibits a (very) low dropout voltage and occupies small area.

Operation of one or more exemplary embodiments as discussed herein involves (at least) a first (input) terminal to receive a voltage VM and a second (input) terminal to receive a voltage VP to produce therefrom a (regulated) output voltage VOUT at a third (output) terminal. For simplicity a same designation will be applied in the following to these input/output terminals and the relative voltages.

One or more embodiments facilitate dealing with operating conditions where, while in normal (typical) conditions the first input voltage VM is sufficiently high to regulate the target output voltage VOUT, and "worst-case" conditions may arise (for various reasons) where VM becomes lower than the target VOUT with the second input voltage VP, when enabled, being high enough to permit regulating VOUT (also) in these conditions.

In one or more embodiments, efficiency of the converter may be increased by regulating VOUT from the "closer" or "closest" voltage. This may involve, e.g., using VM as the input voltage in normal (typical) condition and using VP as the input voltage (only) when VM gets too low to regulate the target VOUT.

Figure 3:
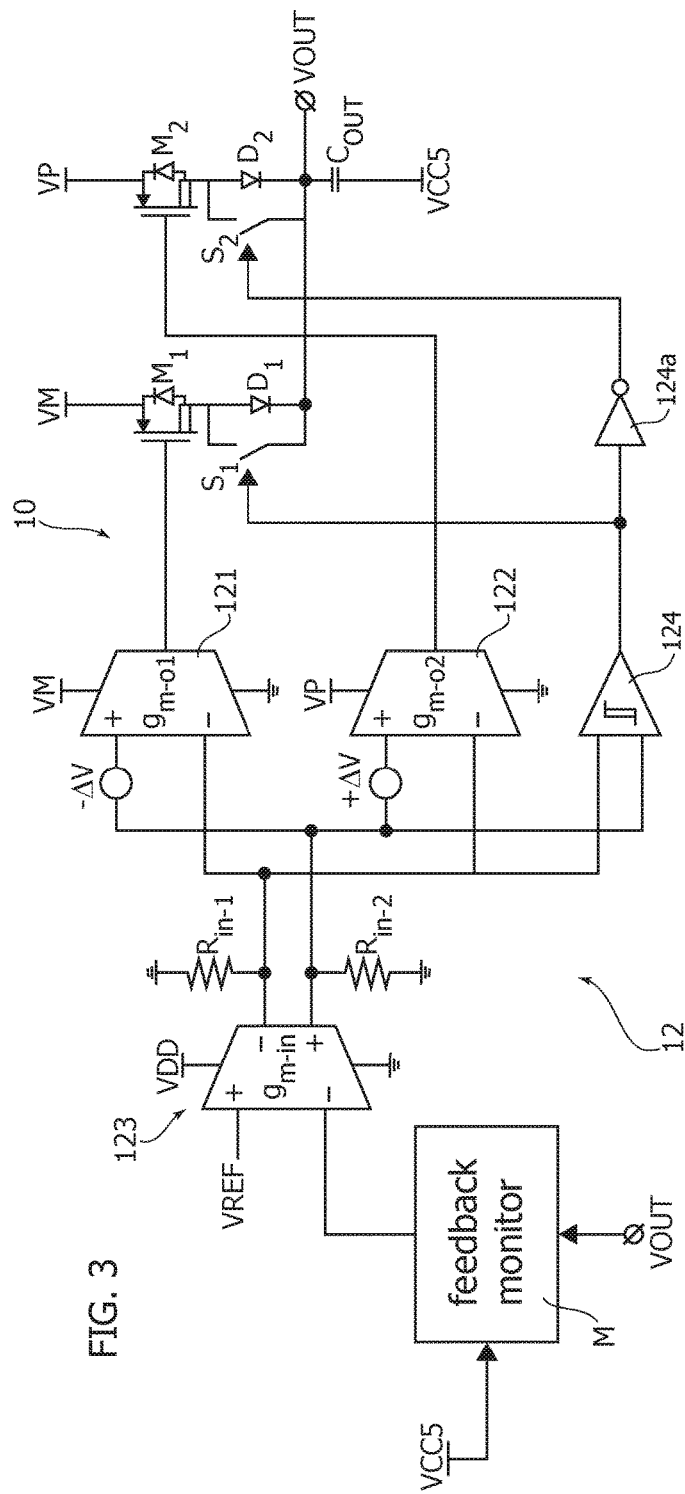
FIG. 3 is a block diagram exemplary of embodiments of the present disclosure.

FIG. 3 shows a possible (simplified) block diagram exemplary of one or more embodiments.

For ease of reference with the basic layout of FIGS. 1 and 2, the block diagram of FIG. 3 is shown to include a monitor block M (of a type known per se) providing feedback from the output VOUT (and possibly sensitive to the voltage VCC5) with the voltage VOUT across the output capacitor $C_{OUT}$ (see right hand side of FIG. 3) provided "on top" of VCC5 to provide a value of, e.g., VCC+5V as desired for supplying the "high-side" driver DR1 of the buck converter of FIG. 2.

It will be otherwise understood that referring to the layout of FIGS. 1 and 2 is merely for ease of understanding and is not intended to be limitative of embodiments. One or more embodiments may in fact be generally applied to circuits where at least two input voltages (e.g., VM and VP) are used to regulate an output voltage VOUT, with VM being a normal, typical input voltage expected to be sufficiently high to regulate the output voltage VOUT, and with VP superseding VM (e.g., only) when VM becomes too low (e.g., lower than the target VOUT).

By proceeding from right to left for simplicity of presentation, a circuit 10 according to one or more embodiments as exemplified in FIG. 3 includes two output transistors $M_1$ and $M_2$ having their current paths (source-drain, in the case of field effect transistors such as MOSFET transistors) extending between the input terminals VM and VP, respectively, and the circuit output terminal, designated simply VOUT.

One or more embodiments may adopt P-channel MOS for $M_1$ and $M_2$ in order to reduce the dropout of the circuit. Also, two diodes $D_1$ and $D_2$ may be added in the current paths between $M_1$, $M_2$ and the output terminal VOUT in order to counter direct current flow from VM to VP and vice versa (as might occur via the output terminal).

In one or more embodiments, in order to further reduce the dropout voltage, the diodes $D_1$ and $D_2$ can be "rectified" (shorted) by means of switches $S_1$ and $S_2$ as detailed in the following.

In the exemplary diagram of FIG. 3, VREF is a reference voltage generated on chip. The monitor block M is used to monitor VOUT, with the output from the block M equal to VREF when VOUT reaches the desired target voltage.

Operation of the exemplary circuit of FIG. 3 is facilitated by controlling the two output transistors ($M_1$ and $M_2$) and the two diodes $D_1$ and $D_2$ as discussed in the following.

In the exemplary diagram of FIG. 3, $M_1$ and $M_2$ are driven by means of an operational transconductance amplifier (OTA) 12 including two output transconductor blocks 121, 122 (gm-o1 and gm-o2) and a common (shared) input transconductor block 123 (gm-in).

In such an arrangement, the block 121 (gm-o1) drives the transistor $M_1$ and the block 122 (gm-o2) drives the transistor $M_2$.

A (first) circuit branch including the block 121 and $M_1$ is biased at VM and a (second) circuit branch including the block 122 and $M_2$ is biased at VP. The input stage or block 123 is biased from a low-voltage (e.g., 1.8V) power supply (not visible in the figure for simplicity).

Specifically, in the exemplary diagram of FIG. 3:

the input block 123 includes a first input (e.g., non-inverting) coupled to the reference voltage VREF and a second input (e.g., inverting) coupled to the output from the monitor block M (feedback from VOUT);

the block 121 (biased at VM) includes a first input (e.g., non-inverting) coupled—with the interposition of an offset generator $-\Delta V$—to a first (e.g., non-inverting) output from the input block 123 loaded with a resistor $R_{in-2}$ coupled to ground as well as a second input (e.g., inverting) coupled to a second (e.g., inverting) output from the input block 123 loaded with a resistor $R_{in-1}$;

the block 122 (biased at VP) includes a first input (e.g., non-inverting) coupled—with the interposition of an offset generator $+\Delta V$—to the first (e.g., non-inverting) output from the input block 123 loaded with the resistor $R_{in-2}$ coupled to ground as well as a second input (e.g., inverting) coupled to the second (e.g., inverting) output from the input block 123 loaded with a resistor $R_{in-1}$.

In the exemplary diagram of FIG. 3, due to the presence of the two offset generators $-\Delta V$ and $+\Delta V$ coupled to respective (e.g., non-inverting) inputs of the blocks 121 and 122, the circuit 10 includes:

a first circuit path supplied by VM and VDD (including the blocks 123, 121 and the transistor $M_1$) which aims at regulating VOUT at a first target value VOUT1=VCC5+5V+$\Delta V$/($g_{m\text{-}in} \cdot R_{in1,2}$), a second circuit path supplied by VP and VDD (including the blocks 123, 122 and the transistor $M_2$) which aims at regulating VOUT at a second target value VOUT2=VCC5+5V−$\Delta V$/($g_{m\text{-}in} \cdot R_{in1,2}$), which may thus be lower than VOUT1, where:

$g_{m\text{-}in}$ is the transconductance of the block 123, and $R_{in1,2}$ is the value of the load resistors $R_{in-1}$, $R_{in-2}$ of the block 123 (which can be assumed to have a same value in view of the differential output of the block 123).

In the exemplary diagram of FIG. 3 the offset generators $-\Delta V$ and $+\Delta V$ will automatically produce two thresholds for the output voltage VOUT, so that, in the exemplary diagram of FIG. 3 (which, based on a common feature of LDO arrangements, has sourcing capability only, that is, can only supply and cannot sink current):

when VM is present and sufficiently high, the circuit will automatically regulate the higher voltage (VOUT=VCC5+5V+$\Delta V$/($g_{m\text{-}in} \cdot R_{in1,2}$)) from VM, with $M_2$ turned off; and when VM becomes too low to be able to regulate VOUT (which may have a higher value than VM, in that case), then $M_2$ turns on and regulates the lower voltage (VOUT=VCC5+5V−$\Delta V$/($g_{m\text{-}in} \cdot R_{in1,2}$)).

Figure 4:
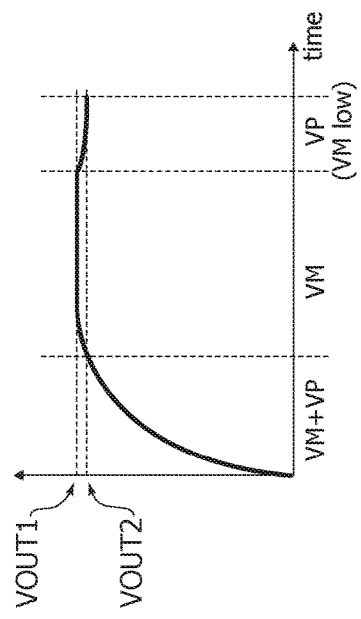
FIG. 4 is a diagram exemplary of possible operation of embodiments of the present disclosure.

The diagram of FIG. 4 shows a possible charging transient for VOUT (ordinate scale) as a function of time (abscissa scale).

It will be appreciated that, in one or more embodiments, as long as VOUT is lower than the two thresholds VOUT1, VOUT2 set by the offset generators $-\Delta V$ and $+\Delta V$ (left-hand side of FIG. 4), current is drawn from both VM and VP (under the reasonable assumption that they are both activated).

When the output VOUT passes the (lower) first threshold VOUT2 (center portion of FIG. 4), the PMOS under VP (that is, $M_2$) will automatically turn off so that current will be drawn only from VM.

If VM becomes too low, e.g., to regulate the higher value for VOUT, namely VOUT1 (right-hand side of FIG. 4), current will be drawn (only) from VP.

The exemplary diagram of FIG. 3 also includes a comparator 124 which compares the signals at the two outputs of the input block 123 (that is the signals applied to the inputs of the blocks 121, 122—without taking into account the offset generators $-\Delta V$ and $+\Delta V$) and drives as a result of the outcome such a comparison the two switches $S_1$, $S_2$ coupled with the diodes $D_1$, $D2$ (with a logic inverter 124a between the comparator 124 and the switch $S_2$).

In the exemplary diagram of FIG. 3, the two outputs of the input block 123 will be unbalanced in order to compensate the offset inserted by means of the offset generators $-\Delta V$ and $+\Delta V$, with the amount of unbalance depending on whether VOUT is being regulated from VM or from VP.

For instance, the comparator 124 may be a low-voltage comparator used to detect the unbalancing with its output is used to rectify (that is to short-circuit) the diode ($D_1$ or $D_2$, depending whether $M_1$ or $M_2$ is activated) so that the diode shorted will virtually disappear from the current path of the activated transistor. This may give rise to an efficient and compact solution with zero dropout thanks to the use of PMOSs and the diodes $D_1$ or $D_2$ being "rectified" when conductive (that is, when forward biased).

Figure 5:
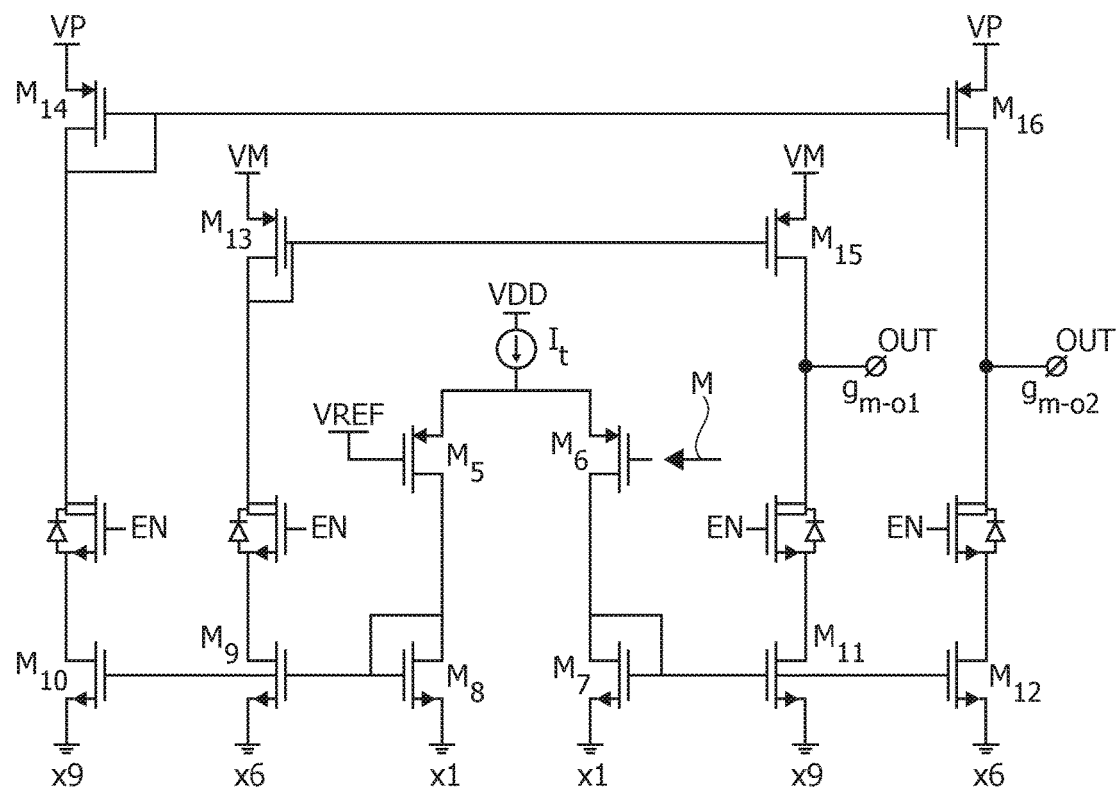
FIG. 5 is exemplary of a possible implementation of one or more embodiments of the present disclosure based on an operational transconductance amplifier (OTA) layout.

FIG. 5 is a transistor-level (e.g., MOSFET) representation of a possible implementation of the operational transconductance amplifier (OTA) arrangement discussed previously.

The exemplary implementation of FIG. 5 includes a mirror OTA in which the input block 123 of FIG. 3 includes $M_5$ and $M_6$. The loading resistors $R_{in1,2}$ are implemented with diode-connected transistors $M_8$ and $M_7$. The (VM-biased) block 121 includes $M_9$, $M_{11}$, $M_{13}$, $M_{15}$ and the (VP-biased) block 122 includes $M_{10}$, $M_{12}$, $M_{14}$, $M_{16}$.

The offset generators $-\Delta V$ and $+\Delta V$ can be obtained by unbalancing the mirroring factors as indicated by the numbers x9, x6 and x1 in FIG. 5. The blocks 121 and 122 can be enabled via a signal EN applied to the control terminals (e.g., gates) of further high-voltage transistors between $M_{10}$, $M_{12}$; $M_9$, $M_{13}$, $M_{11}$, $M_{15}$, $M_{12}$, $M_{16}$, as shown in FIG. 5. These high-voltage transistors also facilitate protecting the low-voltage transistors $M_{10}$, $M_{12}$, $M_9$, $M_{12}$ from the high-voltage inputs VM and VP.

From circuit inspection, the offset±$\Delta V$ generated in the exemplary implementation of FIG. 5 is:

$$\pm\Delta V \approx \pm(3/15)(I_t/g_{m7\text{-}8})$$

where:

$I_t$ is the tail current of the input differential pair ($M_5$ and $M_6$)

$g_{m7\text{-}8}$ is the transconductance of transistors $M_7$ and $M_8$.

A circuit as discussed herein may be used, e.g., in the form of an integrated circuit, in various types of devices such as power management devices.

As exemplified in FIG. 6, a circuit as discussed herein may be used, in a motor driver DC in a hard disk drive (HDD).

A circuit (e.g., 10) according to one or more embodiments may include:

a first supply terminal (e.g., VM), a second supply terminal (e.g., VP, adapted to be connected to a voltage higher than VM) and an output terminal (e.g., VOUT), a first transistor (e.g., $M_1$) having a current path (e.g., source-drain, in the case of a field effect transistor such as a MOSFET) and a control terminal (e.g., gate, in the case of a field effect transistor such as a MOSFET), the current path of the first transistor coupled between the first supply terminal and the output terminal, a second transistor (e.g., $M_2$) having a current path and a control terminal, the current path of the second transistor coupled between the second supply terminal and the output terminal, a first drive circuit block (e.g., 121) coupled to the first supply terminal, the first drive circuit block coupled to the control terminal of the first transistor to provide at said output terminal regulated voltage with a target value (e.g., VOUT1) from said first supply terminal (VM), a second drive circuit block (e.g., 122) coupled to the second supply terminal, the second drive circuit block coupled to the control terminal of the second transistor to provide regulated voltage at said output terminal from said second supply terminal, an input circuit block (e.g., 123) sensitive (e.g., via a monitor circuit M) to the voltage on said output terminal, the input circuit block coupled to the first and second drive circuit blocks and configured to activate the second transistor to provide regulated voltage at said output terminal from said second terminal (e.g., in the place of providing said regulated voltage from said first terminal: see, e.g., the diagram of FIG. 4) as a result of the voltage at said output terminal being lower than the target value.

One or more embodiments may include the second drive circuit block coupled to the control terminal of the second transistor to provide at said output terminal regulated voltage from said second supply terminal with a further target value (e.g., VOUT2), optionally lower than said target value (e.g., VOUT1).

One or more embodiments may include signal generators (−ΔV, +ΔV) with opposed polarities set between the input circuit block (123) and the inputs of the first drive circuit block (121) and the second drive circuit block (122), respectively.

In one or more embodiments, the first drive circuit block and second drive circuit block and the input circuit block may include transconductance circuit blocks.

In one or more embodiments, the first drive circuit block and second drive circuit block and the input circuit block may include differential circuit blocks (e.g., an OTA layout) having non-inverting and inverting inputs, wherein:

the input circuit block includes inputs differentially sensitive to the voltage on said output terminal and to a reference voltage (e.g., VREF), as well as differential outputs (see, e.g., + and − in FIG. 3), the first and second drive circuit blocks include inputs correspondingly or homologously coupled (e.g., with the exemplary polarities shown, with the two non-inverting inputs of 121, 122 coupled to the plus output of 123 and the two inverting inputs of 121, 122 coupled to minus output of 123: signs may change in case of different circuit polarities) to the differential outputs of the input circuit block.

In one or more embodiments:

the input circuit block may include resistively loaded (e.g., $R_{in-1}$, $R_{in-2}$) differential outputs; and/or the first and second drive circuit blocks may include homologous inputs (e.g., non-inverting for both) having coupled signal generators of opposed polarities.

One or more embodiments may include diodes (e.g., $D_1$, $D_2$) in the current paths of the first and second transistors, respectively, to the output terminal, the diodes arranged (e.g., with the exemplary polarities shown, with their cathodes to the output terminal) to counter current flow between the first supply terminal and the second supply terminal via the output terminal.

One or more embodiments may include:

a control circuit (e.g., 124) sensitive to said first and second transistors being active with current flowing in the current paths of the first and second transistors towards the output terminal, and respective switches (e.g., $S_1$, $S_2$) coupled with said diodes, the switches selectively activatable by the control circuit to short-circuit the diodes wherein the diodes shorted permit current flow towards the output terminal.

A device (e.g., 100) according to one or more embodiments may include:

a circuit according to one or more embodiments, a load (e.g., $C_{OUT}$) coupled to the output terminal of the circuit, the load provided with a regulated voltage via the output terminal.

In one or more embodiments the load may have a first terminal coupled to output terminal of the circuit and a second terminal receiving a basis voltage (e.g., VCC5), wherein said regulated voltage via the output terminal of the circuit is provided additively (e.g., "on top," VCC5+5V) to said basis voltage.

Apparatus (see, e.g., HDD; DC in FIG. 6) according to or more embodiments may include a device according to one or more embodiments, the device providing at least one regulated voltage to the apparatus.

In one or more embodiments, such apparatus may include a DC-DC converter (e.g., BC, R, L, C) supplied with said at least one regulated voltage.

A method may include:

providing a circuit according to one or more embodiments, sensing (e.g., 123, M) the voltage on said output terminal, activating the second transistor to provide regulated voltage at said output terminal from said second terminal as a result of the voltage at said output terminal being lower than said first value (VOUT1).

Without prejudice to the underlying principles, the details and embodiments may vary, even significantly, with respect to what has been disclosed by way of example only, without departing from the extent of protection.

The extent of protection is defined by the annexed claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage regulator circuit, comprising:
a first supply terminal configured to receive a first supply voltage;
a second supply terminal configured to receive a second supply voltage;

an output terminal;
a first transistor having a current path and a control terminal, the current path of the first transistor coupled between the first supply terminal and the output terminal;
a second transistor having a current path and a control terminal, the current path of the second transistor coupled between the second supply terminal and the output terminal;
a first drive circuit coupled to the first supply terminal, the first drive circuit coupled to the control terminal of the first transistor, and said first drive circuit configured to provide at said output terminal a regulated voltage with a target value from said first supply voltage on said first supply terminal;
a second drive circuit coupled to the second supply terminal, the second drive circuit coupled to the control terminal of the second transistor and configured to provide at said output terminal the regulated voltage from said second supply voltage on said second supply terminal, wherein the second drive circuit is further configured to provide at said output terminal the regulated voltage from said second supply voltage on said second supply terminal with a further target value, the further target value being lower than said target value; and
an input circuit coupled to the first and second drive circuits, the input circuit configured to control the first drive circuit to deactivate the first transistor and to control the second drive circuit to activate the second transistor to provide the regulated voltage at said output terminal (VOUT) from said second supply voltage on the second terminal in response to the regulated voltage at said output terminal being lower than the target value.

2. The voltage regulator circuit of claim 1 further comprising first and second signal generators with opposed polarities coupled between the input circuit and the first drive circuit and the second drive circuit, respectively.

3. The voltage regulator circuit of claim 2, wherein the first drive circuit, the second drive circuit, and the input circuit each comprise transconductance circuits.

4. The voltage regulator circuit of claim 1, wherein each of the first drive circuit, the second drive circuit, and the input circuit include differential circuits having first and second differential inputs, and wherein:
the input circuit includes the first differential input coupled to receive the voltage on said output terminal and the second differential input coupled to receive a reference voltage, the input circuit further including first and second differential outputs; and
the first and second drive circuits each include the first and second differential inputs coupled respectively with the first and second differential outputs of the input circuit block.

5. The voltage regulator circuit of claim 4 further comprising at least one of:
resistive loads coupled to the first and second differential outputs of the input circuit; or
first and second signal generators of opposed polarities, the first and second signal generators coupled respectively to the first differential inputs of the first and second drive circuits.

6. The voltage regulator circuit of claim 1 further comprising first and second diode circuits coupled in series with the current paths of the first and second transistors, respectively, the first and second diodes circuits configured to counter current flow between the first supply terminal and the second supply terminal through the output terminal.

7. The voltage regulator circuit of claim 6, including:
a control circuit sensitive to said first and second transistors being active with current flowing in the current paths of the first and second transistors to the output terminal; and
respective switches coupled with said first and second diode circuits, the switches selectively activatable by the control circuit to short-circuit the first and second diode circuits to permit current flow to the output terminal through the first and second diode circuits.

8. The voltage regulator circuit of claim 1, wherein each of the first and second transistors comprises a MOSFET.

9. A system, comprising:
a circuit including:
a first supply node configured to receive a first input voltage;
a second supply node configured to receive a second input voltage;
an output node;
a first transistor having a current path and a control node, the current path being coupled between the first supply node and the output node;
a second transistor having a current path and a control node, the current path of the second transistor being coupled between the second supply node and the output node; and
a control circuit coupled to the control nodes of the first and second transistors and configured control activation of the first and second transistors based upon a regulated voltage on the output node, the control circuit configured to control the first transistor to generate from the first input voltage the regulated voltage having a first target value on the output node, and the control circuit configured, in response to the regulated voltage being less than the first target value, to control the second transistor to generate from the second input voltage the regulated voltage on the output node, wherein the control circuit includes:
a first drive circuit coupled to the first supply node and coupled to the control node of the first transistor, the first drive circuit configured to control the first transistor to generate from the first input voltage the regulated voltage having the first target value on the output node; and
a second drive circuit coupled to the second supply node and coupled to the control node of the second transistor, the second drive circuit configured to control the second transistor to generate from the second input voltage the regulated voltage having a second target value on the output node; and
a load coupled to the output node, the load provided with the regulated voltage on the output node.

10. The system of claim 9, wherein the control circuit comprises an operational transconductance amplifier.

11. The system of claim 9, wherein the second target value has a magnitude that is less than a magnitude of the first target value.

12. The system of claim 11, wherein the control circuit is further configured to activate the first and second drive circuits to generate the regulated voltage on the output node in response to the regulated voltage being less than both the first and second target values.

13. The system of claim 9, wherein the load comprises a DC-DC converter.

14. The system of claim 9, wherein the load has a first terminal coupled to the output node of the circuit and a second terminal coupled to receive a basis voltage, and wherein said regulated voltage from the output node is provided additively to said basis voltage.

15. A method, comprising:
coupling a first supply voltage to an output node to generate a regulated voltage on the output node;
sensing whether the regulated output voltage is less than a first target value; and
coupling a second supply voltage to the output node to generate the regulated voltage on the output node in response sensing the regulated output voltage is less than the first target value, wherein coupling the second supply voltage to the output node further includes:
isolating the first supply voltage from the output node, and
sensing whether the regulated output voltage is less a second target value, the second target value being less than the first target value.

16. The method of claim 15 further comprising coupling the first supply voltage and the second supply voltage to the output node in response to the regulated voltage being less than the first and second target values.

17. The method of claim 15, wherein the first supply voltage is an external supply voltage supplied to an integrated circuit and wherein the method further comprises generating the second supply voltage from the first supply voltage, the second supply voltage being greater than the first supply voltage.

* * * * *